(12) United States Patent
Nakao et al.

(10) Patent No.: US 6,498,094 B2
(45) Date of Patent: *Dec. 24, 2002

(54) METHOD FOR PROVIDING A CONTACT HOLE FORMED IN AN INSULATING FILM

(75) Inventors: Keisaku Nakao, Kyoto (JP); Yoichi Sasai, Osaka (JP); Yuji Judai, Kyoto (JP); Atsushi Noma, Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/345,495

(22) Filed: Jul. 1, 1999

(65) Prior Publication Data

US 2001/0023129 A1 Sep. 20, 2001

(30) Foreign Application Priority Data

Jul. 3, 1998 (JP) ............................................. 10-188660

(51) Int. Cl.$^7$ .................. H01L 21/4763; H01L 21/8242
(52) U.S. Cl. ........................ 438/650; 438/686; 438/244; 438/253; 438/678
(58) Field of Search ................................ 257/303, 301, 257/306; 438/650, 238, 239, 243–244, 253, 396, 575, 580, 686, 678

(56) References Cited

U.S. PATENT DOCUMENTS 5,918,118 A * 6/1999 Kim et al. .................. 438/238
6,162,671 A * 12/2000 Lee et al. ....................... 438/2

FOREIGN PATENT DOCUMENTS

| JP | 373549 | * 3/1991 | ........... H01L/21/60 |
| JP | 7-74325 | 3/1995 | |
| JP | 9-275193 | 10/1997 | |

* cited by examiner

Primary Examiner—Chandra Chaudhari
Assistant Examiner—Thanh Nguyen
(74) Attorney, Agent, or Firm—Nixon Peabody LLP; Donald R. Studebaker (57) ABSTRACT

An underlying conductive film made of iridium and having a thickness of about 0.1 μm is formed in a contact hole formed in an insulating film covering a transistor formed in a substrate, except in the top portion of the contact hole. The underlying conductive film covers the sidewall portions of the contact hole and the top surface of the drain region but does not completely fill in the contact hole. A plug made of platinum is filled in the contact hole up to the top portion thereof. Over the contact hole of the insulating film, there is formed a capacitor composed of a lower electrode made of platinum, a capacitor insulating film made of $SrBi_2Ta_2O_9$, and an upper electrode made of platinum in contact relation with the respective upper ends of the underlying conductive film and the plug.

11 Claims, 9 Drawing Sheets

METHOD FOR PROVIDING A CONTACT HOLE FORMED IN AN INSULATING FILM

BACKGROUND OF THE INVENTION

The present invention relates to a semiconductor device having a contact hole (connection hole) formed in an insulating film on a substrate. More particularly, the present invention relates to a semiconductor device having a semiconductor memory such as a DRAM or ferroelectric memory wherein a semiconductor element and a capacitor are electrically connected to each other via a plug within the contact hole and a manufacturing method therefor.

As recent semiconductor memory devices have increased in integration scale, attention has been given to technology for integrating, in a semiconductor substrate, a capacitor having a capacitor insulating film made of a dielectric with a dielectric constant of 30 or more (hereinafter referred to as a high dielectric), thereby providing a sufficient amount of charge accumulated in the capacitor used in a memory cell. Attention has also been given to a so-called ferroelectric memory using a ferroelectric in a capacitor insulating film as a nonvolatile memory operable with a low voltage at a high speed. As a high dielectric or ferroelectric, there has been used a dielectric material composed of a metal oxide such as $Ta_2O_5$, $SrBi_2Ta_2O_9$, or $Ba_xSr_{1-x}TiO_3$ (where x satisfies $0 \leq x \leq 1$), so that the development of technology for integrating such a dielectric into a semiconductor substrate is essential to the implementation of a ferroelectric memory.

A description will be given to a conventional semiconductor memory device with reference to the drawings.

Figure 9:
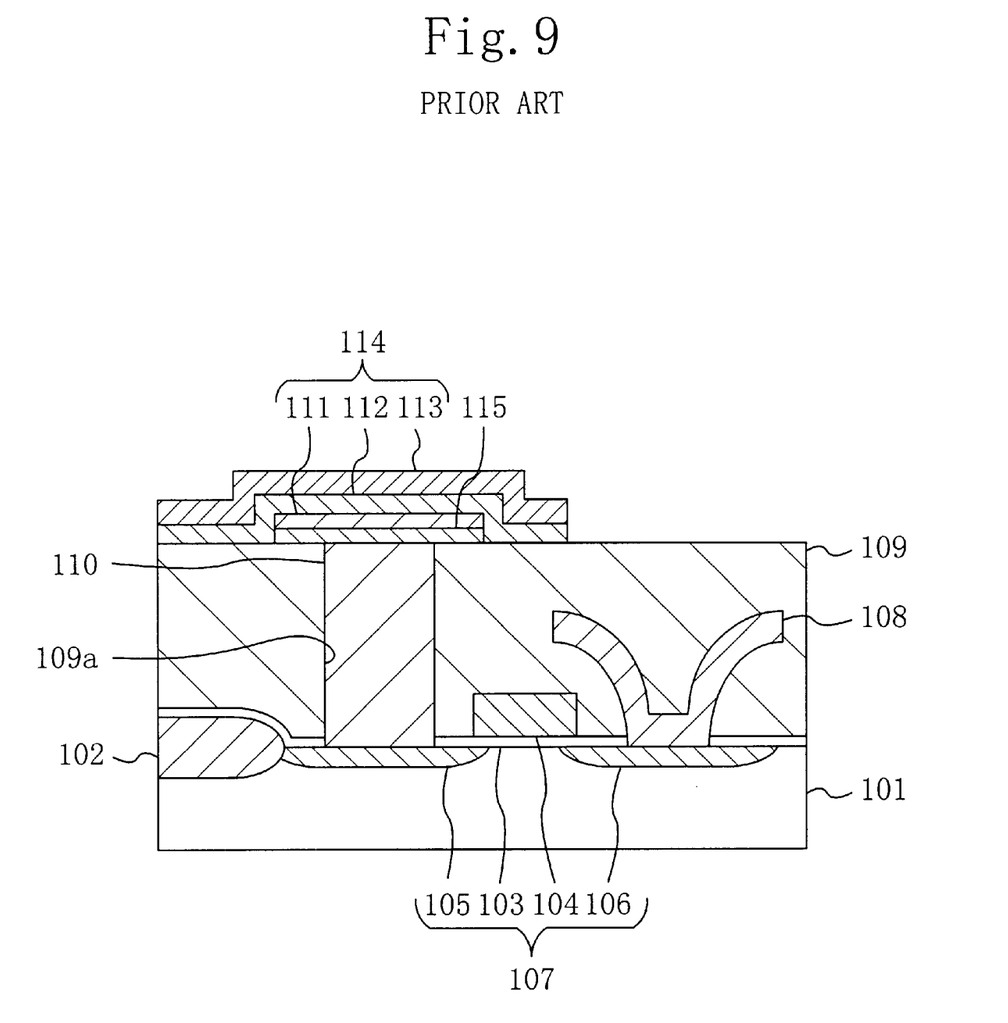
FIG. 9 is a cross-sectional view showing a conventional semiconductor memory device.

FIG. 9 shows a cross-sectional structure of the conventional semiconductor memory device. As shown in FIG. 9, a transistor 107 is formed in the region of a substrate 101 made of p-type silicon doped with a group III element which is isolated by an isolation film 102. The transistor 107 is composed of: a gate electrode 104 made of polysilicon and formed on the substrate 101 via a gate insulating film 103 made of a silicon oxide ($SiO_2$); a source region 106; and a drain region 105. Each of the source region 106 and drain region 105 is formed in an upper portion of the substrate 101 along the gate length of the gate electrode 104 and doped with a group V element.

A bit line 108 made of polysilicon is formed on the source region 106. The transistor 107 and the bit line 108 are covered with a $SiO_2$ insulating film 109. A contact hole 109a is formed in the region of the insulating film 109 overlying the drain region 105 and a plug 110 made of polysilicon is filled in the contact hole 109a.

A capacitor 114 consisting of a lower electrode 111 made of platinum (Pt), a capacitor insulating film 112 made of $SrBi_2Ta_2O_9$, and an upper electrode 113 made of platinum is formed on the insulating film 109 in such a manner as to cover the plug 110. A barrier layer 115 for preventing platinum composing the lower electrode 111 from being diffused into the plug 110 is disposed between the lower electrode 111 and the plug 110. An ohmic contact is made between the barrier layer 115 and the plug 110.

After the semiconductor memory device is formed, an annealing process is normally performed with respect to the semiconductor memory device in an oxygen atmosphere such that the capacitor 114 excellently retains its properties. In the barrier layer 115, therefore, there is used a nitride such as titanium nitride (TiN) or an oxide such as iridium oxide ($IrO_2$) which is less likely to oxidize the surface of the plug 110 made of polysilicon and unreactive to polysilicon and platinum in the lower electrode 111 during the annealing process.

However, the conventional semiconductor memory device has the following problem. If titanium nitride is used in the barrier layer 115, the barrier layer 115 is more likely to lose its conductivity because titanium nitride is oxidized by the annealing process, so that the electric connection between the transistor 107 and the capacitor 114 becomes insufficient.

If an oxide such as iridium oxide is used in the barrier layer 115, the upper surface of the plug 110 is exposed to an oxygen plasma and oxidized during the formation of the barrier layer 115, so that the plug 110 loses its conductivity and the electric connection between the transistor 107 and the capacitor 114 also becomes insufficient. In either case, the problem is encountered that the semiconductor memory device is likely to incur a faulty operation.

SUMMARY OF THE INVENTION

It is therefore an object of the present invention to solve the aforesaid conventional problem and impart high reliability to a contact hole for providing an electric connection between a semiconductor element formed in a substrate and another semiconductor element formed on an insulating film covering the semiconductor element.

To attain the object, the present invention uses a conductive film containing a platinum group element to compose a plug formed in the contact hole as a connection hole. In addition, the present invention provides a barrier layer made of a metal nitride between the substrate and the plug.

Specifically, a first semiconductor device according to the present invention comprises: a substrate formed with a semiconductor element; an insulating film formed on the substrate, the insulating film having a connection hole and covering the semiconductor element; an underlying conductive film formed in at least a lower portion of the connection hole and electrically connected to the semiconductor element; and a conductive film formed in an upper portion of the connection hole and containing a platinum group element.

In the first semiconductor device, each of the underlying conductive film formed in at least the lower portion of the connection hole and the conductive film formed in the upper portion of the connection hole contains a platinum group element, so that the underlying conductive film and the conductive film are not oxidized or, if oxidized, retain conductivity in an annealing process performed in an oxygen atmosphere during the manufacturing of the first semiconductor device. As a result, an excellent electric connection is maintained among the underlying conductive film, the conductive film, and the semiconductor element, which improves the reliability of the device.

In the first semiconductor device, the connection hole preferably has a depth equal to or larger than a minimum diameter of the connection hole. This increases the scale of integration of the semiconductor elements, since the aspect ratio of the connection hole is higher than 1.

Preferably, the first semiconductor device further comprises a dielectric film formed over the conductive film. In the arrangement, the conductive film contains a platinum group element so that the upper end of the conductive film as the plug is used as the lower electrode of the capacitor without any alteration. This allows the omission of the step of forming the lower electrode and reduces the size of the capacitor formed. If the dielectric film is made of a ferroelectric, a nonvolatile memory device can be implemented.

In the first semiconductor device, the conductive film preferably expands over the portion of the insulating film surrounding the connection hole and has a top surface higher in level than an upper end of the connection hole. In the arrangement, the upper end of the conductive film protrudes from the upper end of the connection hole, which renders the upper end of the conductive film more likely to be used as the lower electrode of the capacitor. If an electroplating method using the underlying conductive film as an electrode is used, the conductive film forming the plug can be formed promptly on the underlying conductive film.

In this case, the semiconductor device preferably further comprises a dielectric film formed over the conductive film. In the arrangement, if the upper end of the conductive film is used as the lower electrode of the capacitor, the dielectric film formed over the conductive film is used as the capacitor insulating film, the upper electrode is formed on the capacitor insulating film, and the capacitor can be formed reliably over the connection hole.

In this case, the semiconductor device preferably further comprises a capacitor formed on the insulating film, the capacitor having a lower electrode composed of the conductive film and a capacitor insulating film composed of the dielectric film. If a transistor is used as the semiconductor element in the arrangement, a semiconductor memory device having excellent conduction between the transistor and the capacitor can be implemented.

In the first semiconductor device, the conductive film is preferably filled in the upper portion of the connection hole. This reduces the electric resistance of the conductive film and improves the operating properties of the device.

In this case, the conductive film preferably expands over the portion of the insulating film surrounding the connection hole and has a top surface higher in level than an upper end of the connection hole.

In this case, the first semiconductor device preferably further comprises a dielectric film formed over the conductive film.

In this case, the first semiconductor device preferably further comprises a capacitor formed on the insulating film, the capacitor having a lower electrode composed of the conductive film and a capacitor insulating film composed of the dielectric film.

In this case, the conductive film preferably has a substantially flat top surface. In the arrangement, even when a dielectric film is formed on the conductive film, the resulting dielectric film has a uniform thickness. If the dielectric film is used as the capacitor insulating film, the electric properties of the capacitor are improved.

In the first semiconductor device, the underlying conductive film is preferably formed on a sidewall portion of the connection hole and at least a part of an end face of the underlying conductive film is substantially continued to an end face of the conductive film. In the arrangement, if the upper end (upper surface) of the conductive film is covered with a dielectric film, the underlying conductive film and the conductive film can be covered collectively, which improves the usability of the dielectric film as the capacitor insulating film.

In this case, the conductive film is preferably filled in the upper portion of the connection hole.

A second semiconductor device according to the present invention comprises: a substrate formed with a semiconductor element; an insulating film formed on the substrate, the insulating film having a connection hole and covering the semiconductor element; a conductive film formed in an upper portion of the connection hole and containing a platinum group element; and a barrier layer formed in a lower portion of the connection hole, the barrier layer having conductivity, being electrically connected to the semiconductor element, and preventing a constituent element of the conductive film from being diffused into the substrate.

In the second semiconductor device, the conductive film containing a platinum group element is used as the plug, so that the same effect as achieved by the first semiconductor device can be achieved. Moreover, since the barrier layer for preventing the diffusion of the constituent element of the conductive film into the substrate is provided in the lower portion of the connection hole, the reaction between the platinum group element and the material of the substrate can be prevented, which further improves the operating properties of the device.

In the second semiconductor device, the barrier layer is preferably composed of a metal nitride. The arrangement surely prevents the diffusion of the platinum group element into the substrate.

The second semiconductor device preferably further comprises an underlying conductive film formed between the barrier layer and the conductive film in the connection hole and containing a platinum group element.

In the second semiconductor device, the conductive film preferably expands over the portion of the insulating film surrounding the connection hole and has a top surface higher in level than an upper end of the connection hole.

In this case, the second semiconductor device preferably further comprises a dielectric film formed over the conductive film.

In this case, the second semiconductor device preferably further comprises a capacitor formed on the insulating film, the capacitor having a lower electrode composed of the conductive film and a capacitor insulating film composed of the dielectric film.

In the second semiconductor device, the conductive film preferably has a substantially flat top surface.

In the semiconductor device, the underlying conductive film is preferably formed on a sidewall portion of the connection hole and at least a part of an end face of the underlying conductive film is substantially continued to an end face of the conductive film.

In this case, the conductive film is preferably filled in the upper portion of the connection hole.

A first method of manufacturing a semiconductor device according to the present invention comprises: an insulating film forming step of forming an insulating film over a substrate formed with a semiconductor element such that the semiconductor element is covered with the insulating film; an underlying conductive film forming step of forming, after forming a connection hole in the insulating film, an underlying conductive film containing a platinum group element in at least a lower portion of the connection hole such that the underlying conductive film is electrically connected to the semiconductor element; and a conductive film forming step of forming a conductive film containing a platinum group element in an upper portion of the connection hole by an electroplating method using the underlying conductive film as an electrode.

In accordance with the first method of manufacturing a semiconductor device, the use of, e.g., a sputtering process in the underlying conductive film forming step allows the underlying conductive film to be formed over the entire surface of the insulating film including the sidewall portions of the contact hole and in the lower portion of the contact hole except in the upper portion thereof. If the underlying conductive film is used as the cathode in the subsequent step of forming a conductive film using the electroplating method, therefore, the connection hole can be filled promptly and reliably because the aspect ratio is higher than 1 even when it is difficult to fill the conductive film containing a platinum group element in the connection hole by physical vapor deposition such as sputtering.

In the first method of manufacturing a semiconductor device, the electroplating method is preferably implemented by intermittently applying a voltage to the underlying conductive film. This ensures the formation of the conductive film since the ion concentration of a platinum group element is recovered during periods during which the application of a voltage to the underlying conductive film is intermitted.

In the first method of manufacturing a semiconductor device, the underlying conductive film forming step preferably includes the step of forming the underlying conductive film on a sidewall portion of the connection hole, the method further preferably comprising, after the conductive film forming step, a patterning step of pattering the underlying conductive film and the conductive film such that at least a part of an end face of the underlying conductive film is substantially continued to at least a part of an end face of the conductive film. In the arrangement, if the upper end (upper surface) of the conductive film is covered with a dielectric film, the underlying conductive film and the conductive film can be covered collectively, which improves the usability of the dielectric film as the capacitor insulating film.

Preferably, the first method of manufacturing a semiconductor device further comprises, after the patterning step, the step of forming a dielectric film on the conductive film. In the arrangement, the upper end of the conductive film containing a platinum group element can be used as the lower electrode of the capacitor without any alteration. This allows the omission of the step of forming the lower electrode and reduces the size of the capacitor formed. If the dielectric film is made of a ferroelectric, a nonvolatile memory device can be implemented.

A second method of manufacturing a semiconductor device according to the present invention comprises: an insulating film forming step of forming an insulating film over a substrate formed with a semiconductor element such that the semiconductor element is covered with the insulating film; a barrier layer forming step of forming, after forming a connection hole in the insulating film, a barrier layer in a lower portion of the connection hole, the barrier layer having conductivity, preventing a constituent element of the conductive film formed in the connection hole from being diffused from the conductive film into the substrate, and being electrically connected to the semiconductor element; and a conductive film forming step of forming a conductive film containing a platinum group element in an upper portion of the connection hole.

In accordance with the second method of manufacturing a semiconductor device, the barrier layer for preventing the diffusion of the constituent element of the conductive film formed in the connection hole from the conductive film into the substrate is formed in the lower portion of the connection hole, so that the second semiconductor device according to the present invention is implemented reliably.

In the second method of manufacturing a semiconductor device, the conductive film forming step preferably includes the steps of: forming an underlying conductive film containing a platinum group element on the barrier layer in the connection hole except in the upper portion of the connection hole; and forming the conductive film in the upper portion of the connection hole by an electroplating method using the underlying conductive film as an electrode. If the underlying conductive film is thus formed over the entire surface of the insulating film including the sidewall portions of the connection hole and over the top surface of the barrier layer except in the upper portion of the connection hole and the underlying conductive film is used as the cathode, the connection hole can be filled promptly and reliably with the conductive film even when it is difficult to fill the conductive film containing a platinum group element in the connection hole by physical vapor deposition such as sputtering.

A third method of manufacturing a semiconductor device according to the present invention comprises: an insulating film forming step of forming an insulating film over a substrate formed with a semiconductor element such that the semiconductor element is covered with the insulating film; an underlying conductive film forming step of forming, after forming a connection hole in the insulating film, an underlying conductive film containing a platinum group element in at least a lower portion of the connection hole such that the underlying conductive film is electrically connected to the semiconductor element; a mask pattern forming step of forming, on the insulating film, a mask pattern having an opening located over the connection hole in the insulating film; a conductive film forming step of forming a conductive film containing a platinum group element in an upper portion of the connection hole by an electroplating method using the underlying conductive film as an electrode and using the mask pattern; and an underlying conductive film patterning step of patterning, after removing the mask pattern, the underlying conductive film such that a region of the underlying conductive film covered with the mask pattern is thereby removed.

In accordance with the third method of manufacturing a semiconductor device, the same effect as achieved by the first method of manufacturing a semiconductor device can be achieved. Moreover, since the mask pattern for masking the insulating film except for the region corresponding to the connection hole is formed after the formation of the underlying conductive film, the conductive film containing a platinum group element can be filled reliably only in the upper portion of the connection hole in accordance with the electroplating method using the underlying conductive film as a cathode in the subsequent conductive film forming step. In addition, it is no more necessary to pattern the conductive film.

The third method of manufacturing a semiconductor device preferably further comprises, between the connection hole forming step and the underlying conductive film forming step, the step of forming a barrier layer in the lower portion of the connection hole, the barrier layer having conductivity and preventing a constituent element of the conductive film from being diffused from the conductive film into the substrate. In the arrangement, the barrier layer prevents the reaction between a platinum group element and the constituent element of the material of the substrate, so that the operating properties of the device are further improved.

The third method of manufacturing a semiconductor device preferably further comprises, after the underlying conductive film patterning step, the step of forming a dielectric film on the conductive film. In the arrangement, the upper end of the conductive film containing a platinum group element can be used as the lower electrode of the capacitor without any alteration. This allows the omission of the step of forming the lower electrode and reduces the size of the capacitor formed. If the dielectric film is made of a ferroelectric, a nonvolatile memory device can be implemented.

The third method of manufacturing a semiconductor device preferably further comprises, after the underlying conductive film patterning step, the step of forming, over the conductive film, a capacitor insulating film composed of a dielectric film and an upper electrode to form a capacitor constituted by a lower electrode composed of the conductive film, the capacitor insulating film, and the upper electrode. The arrangement allows the implementation of a semiconductor memory device wherein an excellent electric connection is provided between the semiconductor element in the substrate and the capacitor on the insulating film covering the semiconductor element.

DETAILED DESCRIPTION OF THE INVENTION

Embodiment 1

Referring to the drawings, a first embodiment of the present invention will be described.

Figure 1:
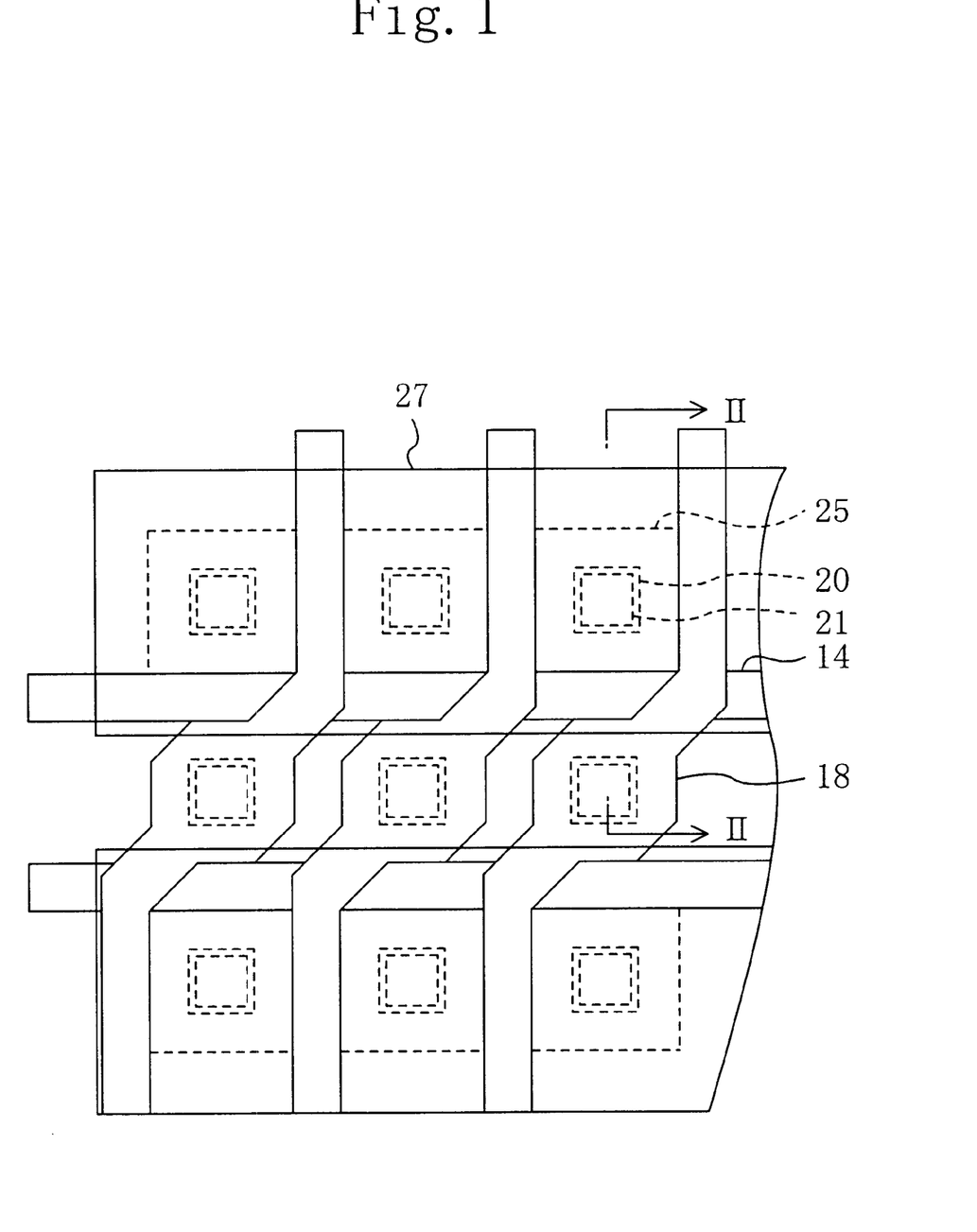
FIG. 1 is a plan view showing a semiconductor memory device according to a first embodiment of the present invention.
Figure 2:
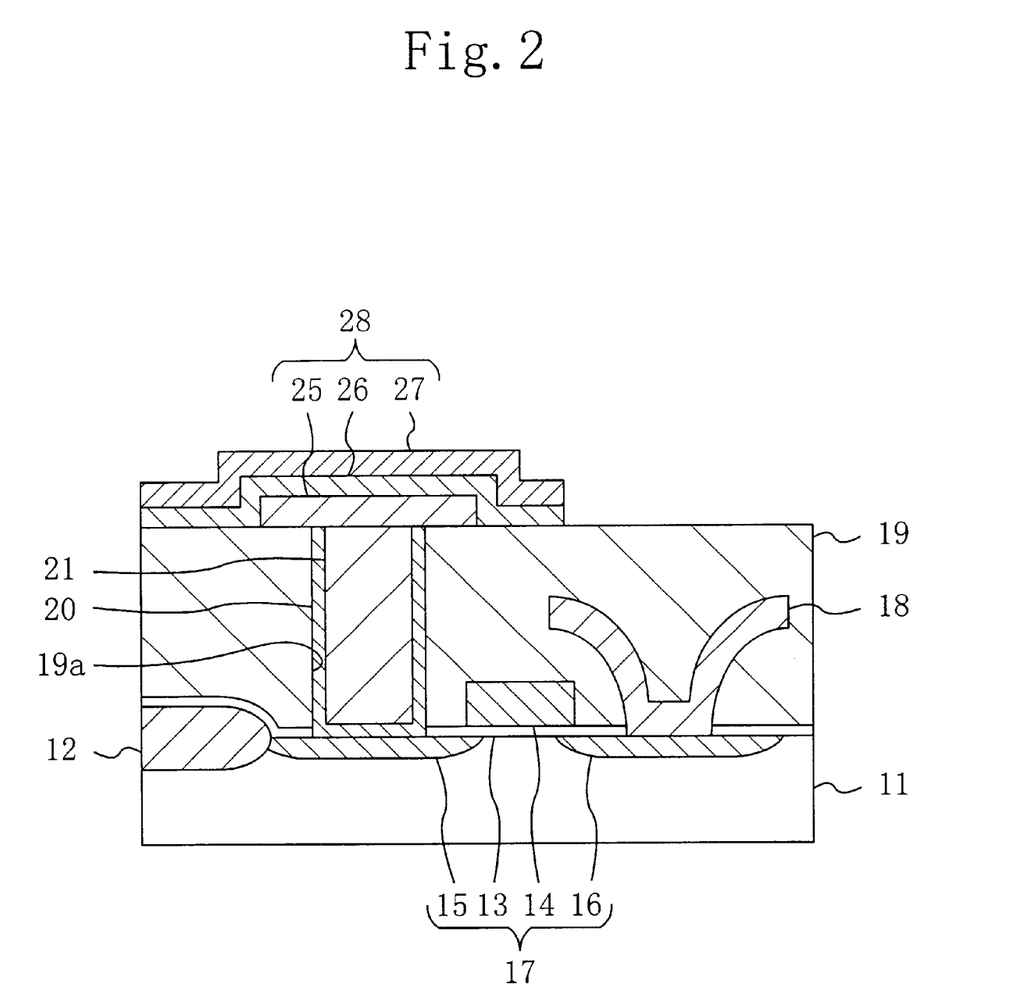
FIG. 2 is a cross-sectional view showing the semiconductor memory device according to the first embodiment, which has been taken along the line II—II of FIG. 1.

FIG. 1 shows a plan structure of a semiconductor memory device according to the first embodiment. FIG. 2 shows a cross-sectional structure taken along the line II—II of FIG. 1. As shown in FIG. 2, a transistor 17 is formed in the region of a substrate 11 made of p-type silicon doped with a group III element which is isolated by an isolation film 12 composed of a LOCOS film or the like. The transistor 17 is composed of: a gate electrode 14 made of polysilicon and formed as a word line on the substrate 11 via a gate insulating film 13 made of $SiO_2$; a source region 16; and a drain region 15. Each of the source region 16 and drain region 15 is formed in an upper portion of the substrate 11 along the gate length of the gate electrode 14 and doped with a group V element.

A bit line 18 made of polysilicon is formed on the source region 16. The transistor 17 and the bit line 18 are covered with a $SiO_2$ insulating film 19 with a thickness of 0.8 μm. A contact hole 19a having a size on the order of 0.5 μm×0.5 μm is formed in the region of the insulating film 19 overlying the drain region 15.

An underlying conductive film 20 made of an iridium (Ir), which is a platinum group element, and having a thickness of about 0.1 μm is formed in the contact hole 19a except in the top portion thereof. The underlying conductive film 20 covers the sidewall portions of the contact hole 19a and the top surface of the drain region 15 but not completely fill in the contact hole 19a. A plug 21 as a conductive film made of platinum (Pt) is filled in the inner portion and the top portion of the contact hole 19a.

A capacitor 28 consisting of a lower electrode 25 made of platinum and having a thickness of about 0.1 μm, a capacitor insulating film 26 made of $SrBi_2Ta_2O_9$ and having a thickness of about 0.2 μm, and an upper electrode 27 made of platinum and having a thickness of about 0.2 μm is formed over the contact hole 19a of the insulating film 19 in contact relation with the upper ends of the underlying conductive film 20 and the plug 21.

According to the first embodiment, the plug 21 is composed of platinum which is resistant to oxidization during the annealing process performed with respect to the capacitor 28 in an oxygen atmosphere, so that electrical conduction between the transistor 17 and the capacitor 28 is not impaired even if oxygen is diffused in the plug 21. Moreover, iridium which retains conductivity even if it is oxidized and effectively suppresses the diffusion of oxygen when it is oxidized is used in the underlying conductive film 20, so that the drain region 15 composed of silicon is prevented from being oxidized by diffused oxygen. This prevents a faulty conduction between the transistor 17 and the capacitor and ensures the operation of a semiconductor memory device in which transistors 17 and capacitors 28 as shown in FIG. 1 are densely packed.

A description will be given to a method of manufacturing the semiconductor memory device thus structured with reference to the drawings.

Figure 3A:
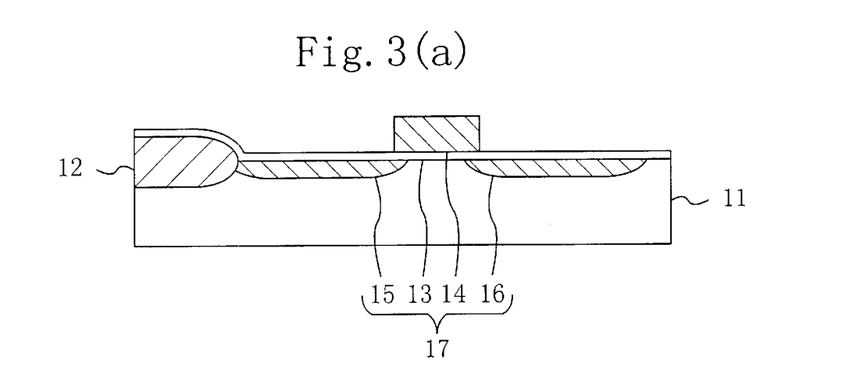
FIGS. 3(a) to 3(c) are cross-sectional views illustrating individual process steps in accordance with a method of manufacturing the semiconductor memory device according to the first embodiment.
Figure 3B:
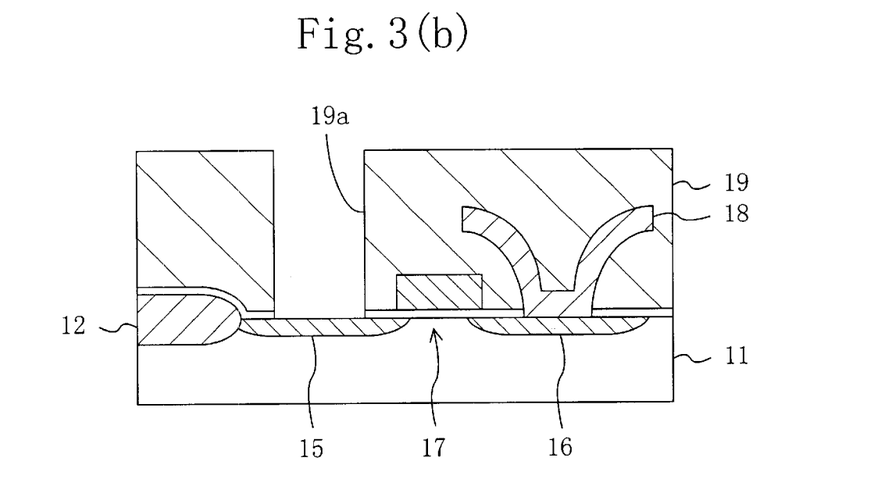
Figure 3C:
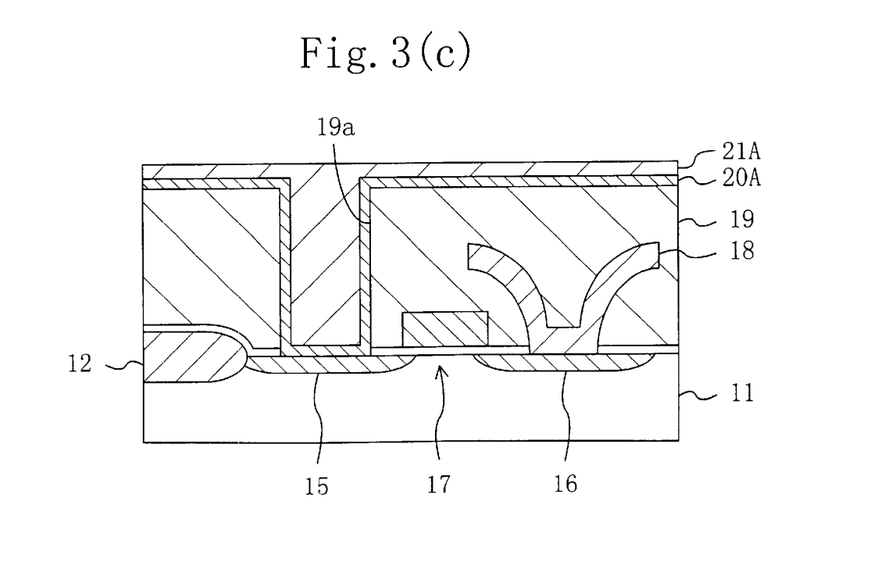

FIGS. 3(a) to 3(c) show cross-sectional structures of the semiconductor memory device in the individual process steps of the manufacturing method therefor according to the first embodiment.

First, as shown in FIG. 3(a), the specified isolation film 12 is formed in the substrate 11 made of p-type silicon and then the gate insulating film 13 composed of a thermal oxide film is formed over the entire surface of the substrate 11. Subsequently, a polysilicon film is deposited over the entire surface of the gate insulating film 13. The deposited polysilicon film is then patterned to form the gate electrode 14 made of polysilicon. Thereafter, arsenic (As) or phosphorus (P) is implanted into the upper regions of the substrate 11 extending along the gate length by ion implantation using the gate electrode 14 as a mask such that the source region 16 and the drain region 15 are formed, whereby the formation of the MOS transistor 17 is completed.

Next, as shown in FIG. 3(b), the bit line 18 made of polysilicon is formed to be connected to the source region 16. As shown in FIG. 1, the bit line 18 is disposed to intersect the gate electrode 14. Thereafter, the insulating film 19 composed of a TEOS film or the like with a thickness of about 0.8 μm is deposited over the entire surface of the substrate 11 to cover the transistor 17 and the bit line 18. Subsequently, dry etching is performed with respect to the region of the deposited insulating film 19 overlying the drain region 15, thereby forming, in the insulating film 19, the contact hole 19a having a size on the order of 0.5 μm×0.5 μm as a connection hole for exposing the drain region 15.

Next, as shown in FIG. 3(c), an iridium film 20A with a thickness of about 0.1 μm is deposited by sputtering over the entire surface of the insulating film 19 including the sidewall portions of the contact hole 19a and over the top surface of the drain region 15 exposed in the contact hole 19a. Subsequently, the substrate 11 is immersed in a metal plating solution containing platinum ions and electrochemical deposition is performed by an electroplating method using the iridium film 20A as a cathode so that a platinum film 21A is filled in the contact hole 19a up to the top portion thereof. During the process, if a voltage is applied intermittently to the electrode, the concentration of platinum ions in the contact hole 19a is recovered during periods during which the voltage is not applied, so that the electrochemical deposition to the inside of the contact hole 19a is performed reliably.

Thereafter, the iridium film 20A and the platinum film 21A formed on the insulating film 19 are removed by etch back method, whereby the underlying conductive film composed of the iridium film 20A filled in the contact hole 19a and the plug 21 composed of the platinum film 21A are formed. Those films 20A and 21A may be removed by chemical mechanical polishing (CMP). Subsequently, the lower electrode 25 made of platinum is deposited by sputtering or the like over the contact hole 19a to come in contact with the upper ends of the underlying conductive film 20 and the plug 21, followed by the capacitor insulating film 26 made of $SrBi_2Ta_2O_9$ and the upper electrode 27 made of platinum which are deposited successively by CVD or like method and by sputtering or like method, respectively. Thereafter, specified patterning is performed with respect to the deposited multilayer film, thereby forming the capacitor 28. Then, an annealing process at a temperature of 700° C. is performed in an oxygen atmosphere at 1 atmospheric pressure, whereby the semiconductor memory device shown in FIGS. 1 and 2 is obtained.

Since the semiconductor memory device according to the first embodiment has the insulating film 19 with a thickness of 0.8 μm and the contact hole 19a which is 0.5 μm square, the aspect ratio is higher than 1. In such a case, it is extremely difficult to fill a metal in the contact hole 19a by sputtering. However, since the present embodiment preliminarily forms, by sputtering, the iridium film 20A functioning as the underlying layer for plating on the sidewall portions of the contact hole 19a and on the top surface of the drain region 15 and then forms the platinum film 21A in the contact hole 19a by an electroplating method using the underlying layer as the electrode, the platinum film 21A can be filled promptly and reliably in the contact hole 19a.

Moreover, since the present embodiment planarizes the top surface of the insulating film 19 by a CMP method, the capacitor 28 and the lower electrode 25 can be formed with no level difference, which improves the adhesion of the lower electrode 25 to the plug 21. Consequently, the electric properties of the capacitor 28 are improved and less likely to vary among the capacitors. Moreover, the diffusion of oxygen during the annealing process is suppressed, which allows the manufacturing of a stably operating semiconductor memory device.

In the case where the underlying conductive film 20 is not formed, the substrate 11 itself may be used properly as the cathode in forming the plug 21. In this case, since the platinum film 21A is not electrochemically deposited on the insulating film 19, the process of removing the platinum film 21A by using a CMP method becomes unnecessary, which provides a simpler manufacturing process.

If the aspect ratio of the contact hole 19a is smaller than 1, the plug 21 may also be filled by sputtering.

Embodiment 2

Referring to the drawings, a second embodiment of the present invention will be described.

Figure 4:
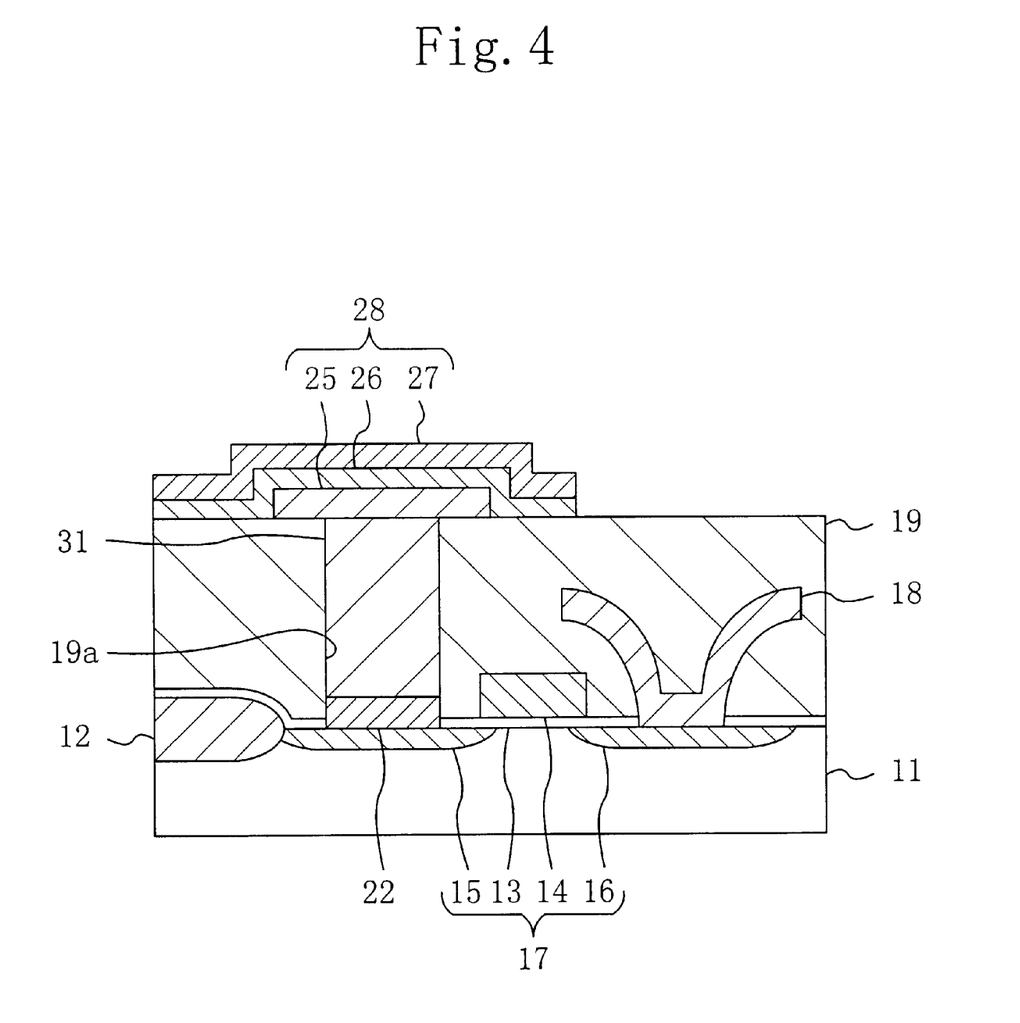
FIG. 4 is a cross-sectional view showing a semiconductor memory device according to a second embodiment of the present invention.

FIG. 4 shows a cross-sectional structure of a semiconductor memory device according to the second embodiment. In FIG. 4, the description of the same components as used in FIG. 2 will be omitted by retaining the same reference numerals therefor. As shown in FIG. 4, a plug 31 made of iridium is formed in a contact hole 19a for providing an electric connection between the drain region 15 of a transistor 17 and a capacitor 28. A barrier layer 22 made of titanium nitride (TiN) with a thickness of 30 nm is formed between the plug 31 and the drain region 15 to prevent the diffusion of iridium composing the plug 31 into the substrate 11.

According to the second embodiment, iridium composing the plug 31 retains conductivity even when it is oxidized, so that electrical conduction between the transistor 17 and the capacitor 28 is not impaired even if oxygen is diffused into the plug 31 by an annealing process performed in an oxygen atmosphere. Moreover, since the barrier layer 22 is provided between the plug 31 and the drain region 15, iridium composing the plug 31 is prevented from being diffused into the drain region 15. This prevents the formation of a reactive layer resulting from the reaction between iridium and silicon at the interface between the drain region 15 and the plug 31 so that a semiconductor memory device excellent in operating properties is surely obtained.

To reduce the contact resistance between the barrier layer 22 and the drain region 15, a multilayer structure is preferably formed, in which the lower portion (closer to the substrate) of the barrier layer 22 is composed of titanium and the upper portion (closer to the plug) thereof is composed of titanium nitride.

A description will be given to a method of manufacturing the semiconductor memory device thus structured with reference to the drawings.

Figure 5A:
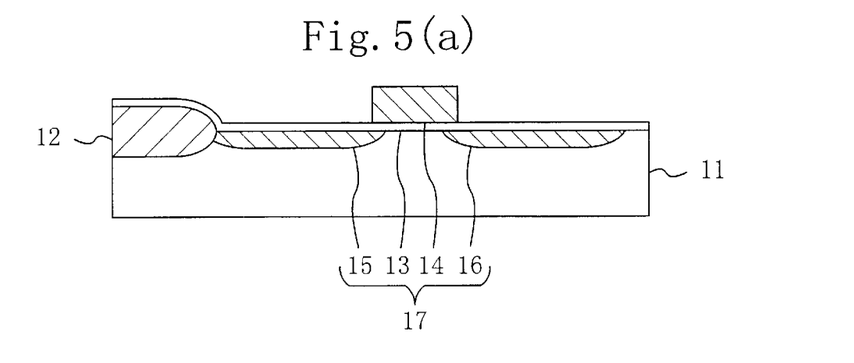
FIGS. 5(a) to 5(c) are cross-sectional views illustrating individual process steps in accordance with a method of manufacturing the semiconductor memory device according to the second embodiment.
Figure 5B:
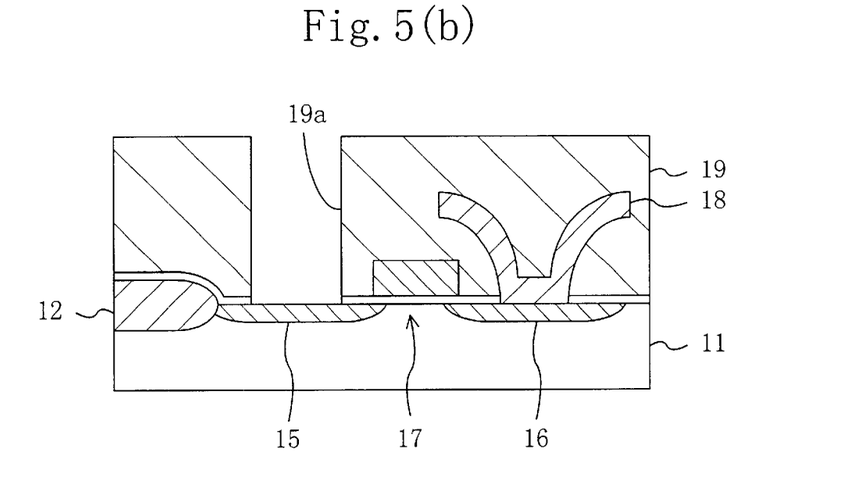
Figure 5C:
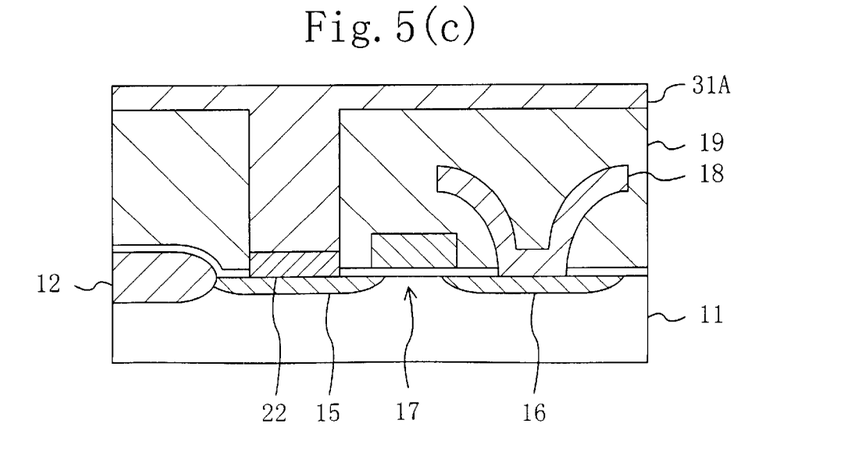

FIGS. 5(a) to 5(c) show cross-sectional structures of the semiconductor memory device in the individual process steps of the manufacturing method therefor according to the second embodiment.

First, as shown in FIG. 5(a), a specified isolation film 12 is formed in the substrate 11 made of p-type silicon and then a gate insulating film 13 composed of a thermal oxide film is formed over the entire surface of the substrate 11. Subsequently, a polysilicon film is deposited over the entire surface of the gate insulating film 13. The deposited polysilicon film is then patterned to form a gate electrode 14 made of polysilicon. Thereafter, arsenic (As) or the like is implanted into the upper regions of the substrate 11 extending along the gate length by ion implantation using the gate electrode 14 as a mask such that the source region 16 and the drain region 15 are formed, whereby the formation of the MOS transistor 17 is completed.

Next, as shown in FIG. 5(b), a bit line 18 made of polysilicon is formed to be connected to the source region 16. Thereafter, an insulating film 19 composed of a TEOS film or the like with a thickness of about 0.8 μm is deposited over the entire surface of the substrate 11 to cover the transistor 17 and the bit line 18. Subsequently, dry etching is performed with respect to the region of the deposited insulating film 19 overlying the drain region 15, thereby forming, in the insulating film 19, the contact hole 19a for exposing the drain region 15 which has a size on the order of 0.5 μm×0.5 μm.

Next, as shown in FIG. 5(c), the barrier layer 22 composed of titanium nitride or a multilayer consisting of titanium and titanium nitride and having a thickness of 30 nm is formed by sputtering on the portion of the drain region 15 exposed in the contact hole 19a. Subsequently, an iridium film 31A is deposited by sputtering over the entire surface of the insulating film 19 including the sidewall portions of the contact hole 19a and over the top surface of the barrier layer 22 such that the contact hole 19a is filled with the iridium film 31A. Thereafter, the iridium film 31A formed on the insulating film 19 is removed by chemical mechanical polishing (CMP), whereby the plug 31 composed of the iridium film 31A filled in the contact hole 19a is formed. Subsequently, the capacitor 28 consisting of the lower electrode 25, the capacitor insulating film 26, and the upper electrode 27 is formed over the contact hole 19a to come in contact with the upper end of the plug 31, similarly to the first embodiment. Then, an annealing process at a temperature of 700° C. is performed in an oxygen atmosphere at 1 atmospheric pressure, whereby the semiconductor memory device shown in FIG. 4 is obtained.

Thus, the manufacturing method according to the present embodiment uses iridium which does not lose conductivity even when it is oxidized for the plug 31 in the contact hole 19a and provides the barrier layer 22 between the plug 31 and the substrate 11 for preventing iridium in the plug 31 from reacting with silicon in the transistor 17. This allows the manufacturing of a semiconductor memory device free from a faulty operation caused by the annealing process performed in an oxygen atmosphere. Moreover, since the top surface of the insulating film 19 is planarized by using CMP, the lower electrode 25 of the capacitor 28 can be formed with no level difference, so that the adhesion of the lower electrode 25 to the plug 31 is improved.

To deposit the iridium film 31A, an electroplating method is used appropriately. Specifically, the substrate 11 is immersed in a metal plating solution containing iridium ions and electrochemical deposition is performed till the iridium film 31A is filled in the contact hole 19a up to the top portion thereof. The use of the electroplating method allows the iridium film 31A to be filled in the contact hole 19a promptly and reliably. Moreover, since the iridium film 31A is formed only within the contact hole 19a because of the insulating film 19 used as a mask, the step of removing the iridium film 31A from the insulating film 19 by using the CMP method becomes unnecessary, which provides a simpler manufacturing process.

Variation of Embodiment 2

Referring to the drawings, a variation of the second embodiment of the present invention will be described.

Figure 6:
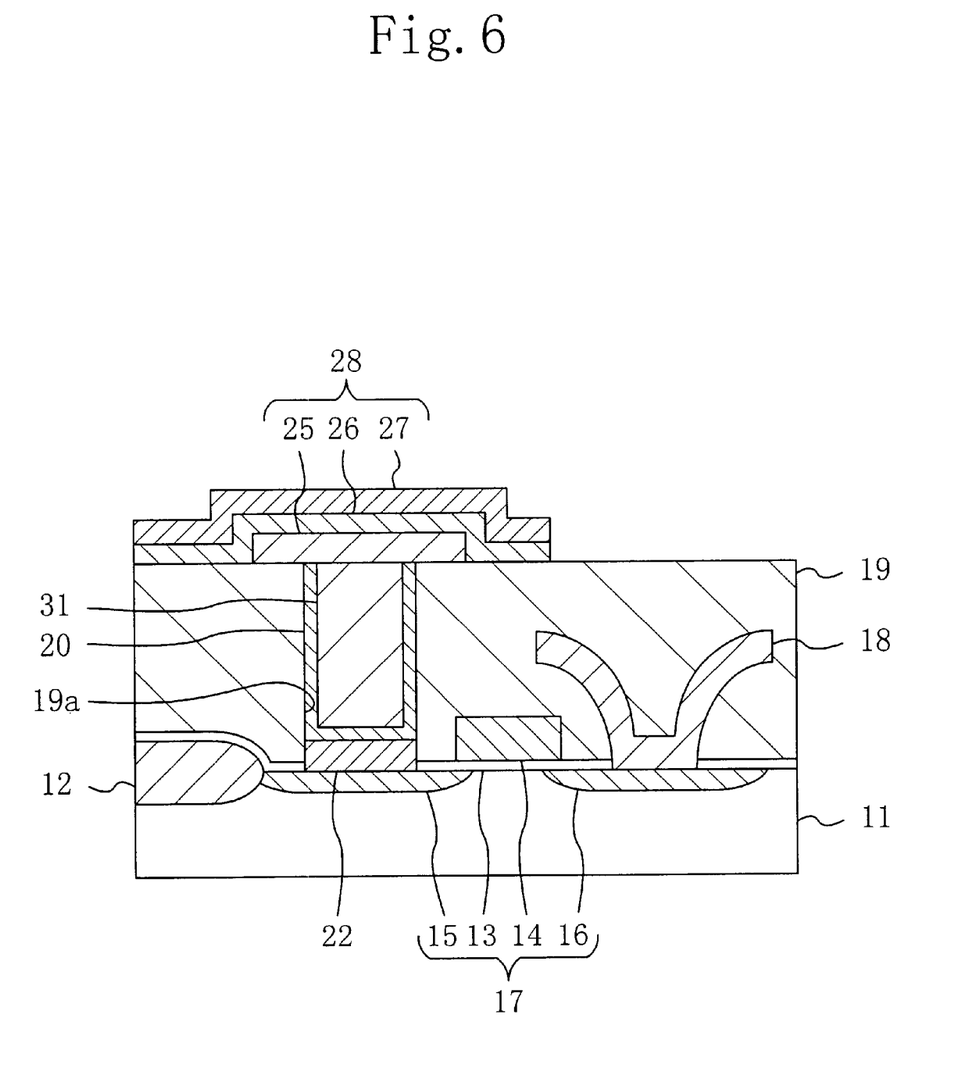
FIG. 6 is a plan view showing a semiconductor memory device according to a variation of the second embodiment.

FIG. 6 shows a cross-sectional structure of a semiconductor memory device according to the variation of the second embodiment. In FIG. 6, the description of the same components as used in FIG. 4 will be omitted by retaining the same reference numerals therefor. As shown in FIG. 6, the semiconductor memory device according to the present variation has an underlying conductive film 20 made of iridium and having a thickness of about 0.1 μm between the sidewall portions of the contact hole 19a and the plug 31 and between the barrier layer 22 and the plug 31.

In the semiconductor memory device thus structured, an iridium film is deposited by sputtering over the entire surface of the insulating film 19 including the sidewall portions of the contact hole 19a and over the top surface of the barrier layer 22 after the step of forming the contact hole shown in FIGS. 5. Then, electroplating is performed by using the iridium film deposited on the insulating film 19 as a cathode and by using a metal plating solution containing iridium ions to fill the iridium film 31A in the contact hole 19a till the iridium film 31A reaches the top portion of the contact hole 19a, whereby the plug 31 is formed.

In forming the plug 31 by the electroplating method, the present variation preliminarily forms the underlying conductive film 20 made of iridium over the entire surface of the insulating film 19 including the contact hole 19a, so that the iridium film 31A is filled in the contact hole more easily and promptly. In the present variation also, the application of a voltage in the electroplating method is performed preferably intermittently.

Embodiment 3

Referring to the drawings, a third embodiment of the present invention will be described.

Figure 7:
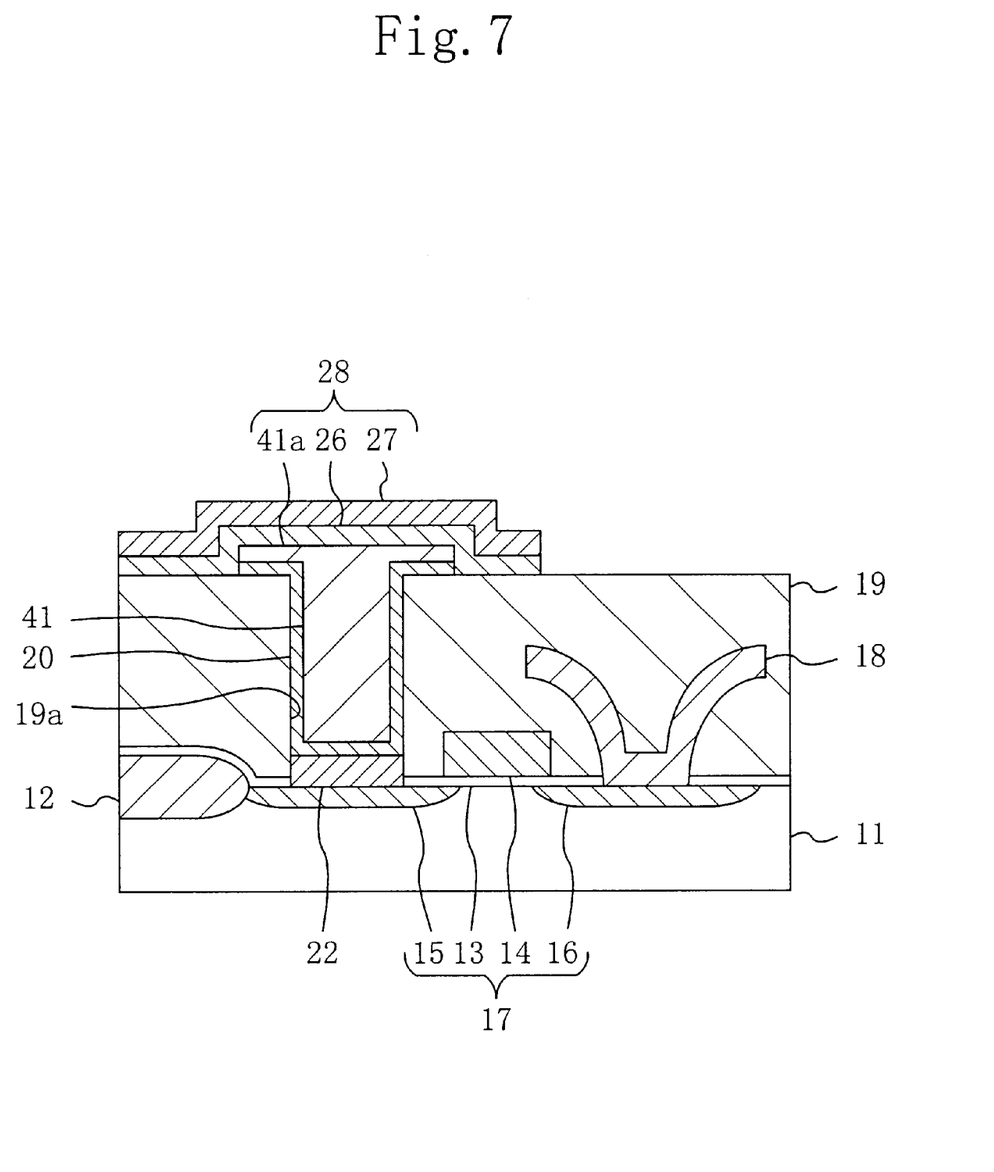
FIG. 7 is a cross-sectional view showing a semiconductor memory device according to a third embodiment of the present invention.

FIG. 7 shows a cross-sectional structure of a semiconductor memory device according to the third embodiment. In FIG. 7, the description of the same components as used in FIG. 2 will be omitted by retaining the same reference numerals therefor. As shown in FIG. 7, a plug 41 made of platinum is formed in a contact hole 19a for providing an electric connection between the drain region 15 of a transistor 17 and a capacitor 28 which has a depth on the order of 0.8 μm. A barrier layer 22 made of titanium nitride with a thickness of about 30 nm is formed between the plug 41 and the drain region 15 via an underlying conductive film 20 made of iridium and having a thickness of about 0.1 μm.

The underlying conductive film 20 is formed not only on the top surface of the barrier layer 22 but also over the side portions of the insulating film 19 defining the sidewalls of the contact hole 19a and extensively over the top portion thereof surrounding the contact hole 19a.

As shown in FIG. 7, the upper end of the plug 41 extends laterally over the underlying conductive film 20 in a stacked relationship and is patterned to have end faces substantially continued to the end faces of the underlying conductive film 20 on the insulating film 19. Accordingly, the top surface of the plug 41 is higher in level than the upper end of the contact hole 19a by about 0.2 μm.

Thus, the plug 41 has an extended portion 41a protruding, along with the underlying conductive film 20, over the insulating film 19. The capacitor 28 according to the present embodiment is characterized in that it uses the extended portion 41a as the lower electrode.

According to the third embodiment, since the plug 41 is composed of platinum which is resistant to oxidization during the annealing process performed with respect to the capacitor 28 in an oxygen atmosphere, electrical conduction between the transistor 17 and the capacitor 28 is not impaired even when oxygen is diffused into the plug 41. On the other hand, since iridium retaining conductivity even if it is oxidized and preventing the diffusion of oxygen is used for the underlying conductive film 20, the drain region 15 made of silicon is prevented from being oxidized by diffused oxygen. This prevents the occurrence of faulty conduction between the transistor 17 and the capacitor and ensures the operation of a semiconductor memory device that has been scaled down.

Moreover, since the lower electrode of the capacitor 28 is formed integrally with the plug 41, the reaction occurring therebetween if the plug and the lower electrode are composed of different members can be prevented.

The provision of the barrier layer 22 may be omitted to achieve a simpler manufacturing process. In this case, however, a slight reaction may occur between iridium in the underlying conductive film 20 and silicon in the substrate 11.

A description will be given to a method of manufacturing the semiconductor memory device thus structured with reference to the drawings.

Figure 8A:
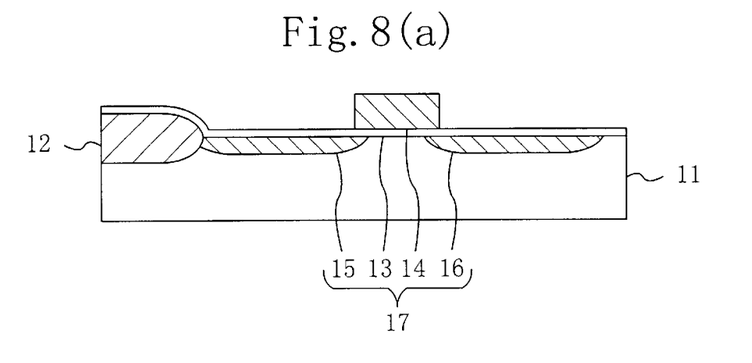
FIGS. 8(a) to 8(c) are cross-sectional views illustrating individual process steps in accordance with a method of manufacturing the semiconductor memory device according to the third embodiment.
Figure 8B:
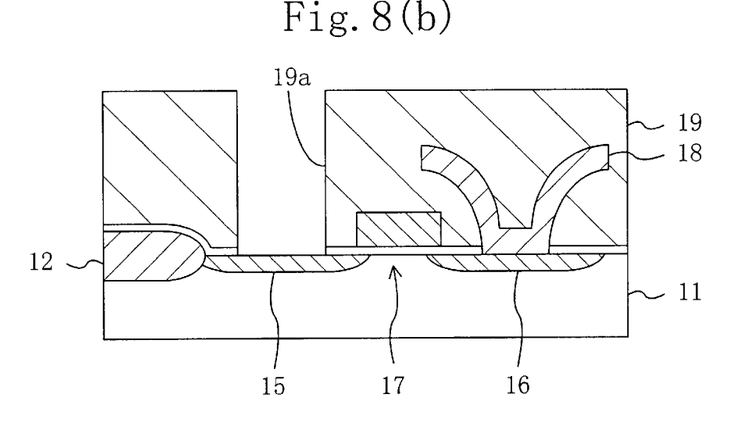
Figure 8C:
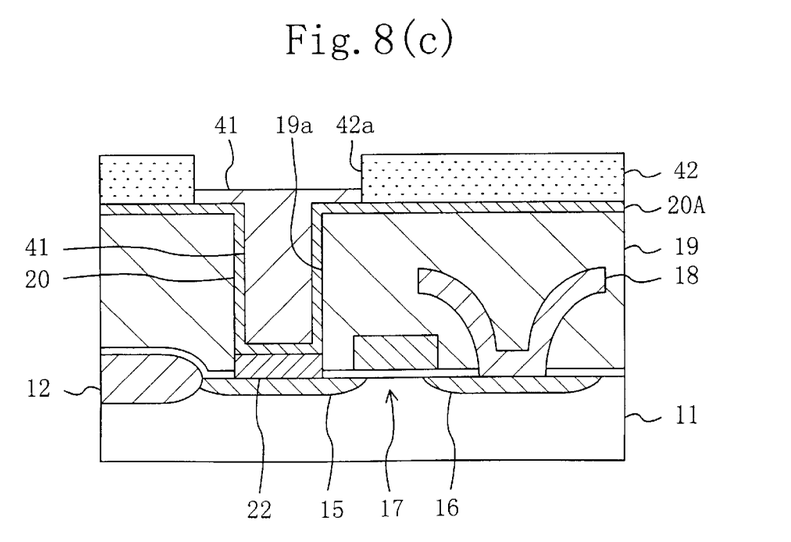

FIGS. 8(a) to 8(c) show cross-sectional structures of the semiconductor memory device in the individual process steps of the manufacturing method therefor according to the third embodiment.

First, as shown in FIG. 8(a), the specified isolation film 12 is formed in the substrate 11 made of p-type silicon and then a gate insulating film 13 composed of a thermal oxide film is formed over the entire surface of the substrate 11. Subsequently, a polysilicon film is deposited over the entire surface of the gate insulating film 13. The deposited polysilicon film is patterned to form a gate electrode 14 made of polysilicon. Thereafter, arsenic (As) or the like is implanted into the upper regions of the substrate 11 extending along the gate length by ion implantation using the gate electrode 14 as a mask such that a source region 16 and a drain region 15 are formed, whereby the formation of the MOS transistor 17 is completed.

Next, as shown in FIG. 8(b), a bit line 18 made of polysilicon is formed to be connected to the source region 16. Thereafter, the insulating film 19 composed of a TEOS film or the like having a thickness of about 0.8 μm is deposited over the entire surface of the substrate 11 to cover the transistor 17 and the bit line 18. Subsequently, dry etching is performed with respect to the region of the deposited insulating film 19 overlying the drain region 15, thereby forming, in the insulating film 19, the contact hole 19a for exposing the drain region 15 which has a size on the order of 0.5 μm×0.5 μm.

Next, as shown in FIG. 8(c), the barrier layer 22 composed of titanium nitride or a multilayer consisting of titanium and titanium nitride and having a thickness of 30 nm is formed by sputtering on the region of the drain region 15 exposed in the contact hole 19a. Subsequently, an iridium film 20A with a thickness of 0.1 μm is deposited by sputtering over the entire surface of the insulating film 19 including the sidewall portions of the contact hole 19a and over the top surface of the barrier layer 22. Thereafter, a resist pattern 42 having an opening 42a corresponding to the contact hole 19a and the surrounding portion is formed on the iridium film 20A by using a lithographic process. Subsequently, the substrate 11 is immersed in a metal plating solution containing platinum ions and the plug 41 made of platinum is formed over the iridium film 20A including the portion covering the sidewall portions of the contact hole 19a and the portion surrounding the upper end of the contact hole 19a by an electroplating method using the iridium film 20A as a cathode and using the resist pattern 42 as a mask. During the process, if a voltage is applied intermittently to the electrode, the concentration of platinum ions in the contact hole 19a is recovered during periods during which the voltage is not applied, so that the electrochemical deposition to the inside of the contact hole 19a is performed reliably.

Next, the resist pattern 42 is removed and the region of the iridium film 20A covered with the resist film 42 is removed to provide the end faces of the plug 41 which are substantially flush with the end faces of the iridium film 20A on the insulating film 19. Subsequently, the capacitor insulating film 26 is formed on the plug 41 in contact relation with the top surface of the plug 41, followed by the upper electrode 27 formed thereon, whereby the capacitor 28 consisting of the lower electrode composed of the extended portion 41a of the plug, the capacitor insulating film 26, and the upper electrode 27 is implemented. Then, an annealing process at a temperature of 700° C. is performed in an oxygen atmosphere at 1 atmospheric pressure, whereby the semiconductor memory device shown in FIG. 7 is obtained.

If the aspect ratio of the contact hole 19a is smaller than 1, the plug 41 may be formed by sputtering, instead of electroplating. In this case, if the resist pattern 42 is lifted off, the platinum film deposited on the resist pattern 42 can be removed simultaneously.

Thus, in the manufacturing method according to the present embodiment, the region in which the plug 41 made of platinum is to be deposited can be limited by using, as a mask, the resist pattern 42 having the opening 42a corresponding to the contact hole 19a and the surrounding portion on the insulating film 19, which allows the plug 41 for filling in the contact hole 19a and the lower electrode of the capacitor 28 to be formed simultaneously and provides a simpler manufacturing process.

Although platinum or iridium is used in the plugs 21, 31, and 41 in the individual embodiments and the variation thereof, another platinum group element may also be used instead. For example, osmium (Os), palladium (Pd), rhodium (Rh) or ruthenium (Ru) maybe used instead. It is also possible to use rhenium (Re), which is not a platinum group element. Alternatively, an alloy of two or more of the foregoing elements may also be used.

Although titanium nitride has been used for the barrier layer 22, another metal nitride may also be used instead. In particular, a nitride of a IV, V, or VI group metal, such as tungsten nitride (WN) or tantalum nitride (TaN), is used preferably.

Although $SrBi_2Ta_2O_9$ has been used for the capacitor insulating film 26 of the capacitor 28, a high dielectric such as $Ta_2O_5$ or $Ba_xSr_{1-x}TiO_3$ (where x satisfies $0 \leq x \leq 1$) or a ferroelectric such as $PbZr_yTi_{1-y}O_3$ (where y satisfies $0 \leq y \leq 1$) may also be used instead.

A semiconductor element electrically connected via the plug is not limited to a transistor or a capacitor. For example, a semiconductor element such as a resistor may be provided in place of the transistor 17.

Although p-type silicon has been used for the substrate 11, n-type silicon may also be used instead. In this case, it will easily be appreciated that the source region 16 and the drain region 15 of the transistor 17 are formed by doping the substrate 11 with a III group element.

What is claimed is:

1. A method of manufacturing a semiconductor device, comprising:
    an insulating film forming step of forming an insulating film over a substrate formed with a semiconductor element such that said semiconductor element is covered with the insulating film;
    an underlying conductive film forming step of forming an underlying conductive film containing a platinum group element in at least a lower portion of a connection hole such that the underlying conductive film is electrically connected to said semiconductor element; and
    a conductive film forming step of forming selectively a conductive film containing a platinum group element in an upper portion of said connection hole by an electroplating method using said underlying conductive film as an electrode.

2. The method of manufacturing a semiconductor device according to claim 1, wherein said electroplating method is implemented by intermittently applying a voltage to said underlying conductive film.

3. The method of manufacturing a semiconductor device according to claim 1, wherein said underlying conductive film forming step includes the step of forming said underlying conductive film on a sidewall portion of said connection hole, said method further comprising, after the conductive film forming step, a patterning step of patterning said underlying conductive film and said conductive film such that at least a part of an end face of said underlying conductive film is substantially continued to at least a part of an end face of said conductive film.

4. The method of manufacturing a semiconductor device according to claim 3, further comprising, after said patterning step, the step of forming a dielectric film on said conductive film.

5. A method of manufacturing a semiconductor device, comprising:

an insulating film forming step of forming an insulating film over a substrate formed with a semiconductor element such that said semiconductor element is covered with the insulating film;

a barrier layer forming step of forming a barrier layer in a lower portion of said connection hole, said barrier layer having conductivity, preventing a constituent element of said conductive film formed in a connection hole from being diffused from the conductive film into the substrate, and being electrically connected to said semiconductor element;

a conductive film forming step of forming selectively a conductive film containing a platinum group element in an upper portion of said connection hole thereby forming a plug in said connection hole;

a capacitor forming step of forming a capacitor, wherein the capacitor has a lower electrode and the lower electrode is formed in contact with the plug.

6. The method of manufacturing a semiconductor device according to claim 5, wherein said conductive film forming step includes the steps of:

forming an underlying conductive film containing a platinum group element on said barrier layer in said connection hole except in the upper portion of the connection hole; and forming said conductive film in the upper portion of said connection hole by an electroplating method using said underlying conductive film as an electrode.

7. A method of manufacturing a semiconductor device, comprising:

an insulating film forming step of forming an insulating film over a substrate formed with a semiconductor element such that said semiconductor element is covered with the insulating film;

an underlying conductive film forming step of forming an underlying conductive film containing a platinum group element in at least a lower portion of a connection hole such that the underlying conductive film is electrically connected to said semiconductor element;

a mask pattern forming step of forming, on said insulating film, a mask pattern having an opening located over the connection hole in said insulating film;

a conductive film forming step of forming selectively a conductive film containing a platinum group element in an upper portion of said connection hole by an electroplating method using said underlying conductive film as an electrode and using said mask pattern; and an underlying conductive film patterning step of patterning, after removing said mask pattern, said underlying conductive film such that a region of the underlying conductive film covered with said mask pattern is thereby removed.

8. The method of manufacturing a semiconductor device according to claim 7, further comprising, between said connection hole forming step and said underlying conductive film forming step, the step of forming a barrier layer in the lower portion of said connection hole, said barrier layer having conductivity and preventing a constituent element of said conductive film from being diffused from the conductive film into the substrate.

9. The method of manufacturing a semiconductor device according to claim 7, further comprising, after said underlying conductive film patterning step, the step of forming a dielectric film on said conductive film.

10. The method of manufacturing a semiconductor device according to claim 7, further comprising, after said underlying conductive film patterning step, the step of forming, over said conductive film, a capacitor insulating film composed of a dielectric film and an upper electrode to form a capacitor constituted by a lower electrode composed of said conductive film, said capacitor insulating film, and said upper electrode.

11. A method of manufacturing a semiconductor device, comprising:

an insulating film forming step of forming an insulating film over a substrate formed with a semiconductor element such that said semiconductor element is covered with the insulating film;

a barrier layer forming step of forming a barrier layer in a lower portion of said connection hole, said barrier layer having conductivity, preventing a constituent element of said conductive film formed in a connection hole from being diffused from the conductive film into the substrate, and being electrically connected to said semiconductor element;

a conductive film forming step of forming selectively a conductive film containing a platinum group element in an upper portion of said connection hole;

wherein said conductive film forming step includes the steps of:

forming an underlying conductive film containing a platinum group element on said barrier layer in said connection hole except in the upper portion of the connection hole; and forming said conductive film in the upper portion of said connection hole by an electroplating method using said underlying conductive film as an electrode.

* * * * *